(12) United States Patent
Li et al.

(10) Patent No.: US 12,727,345 B2
(45) Date of Patent: Sep. 1, 2026

(54) DISPLAY DEVICE WITH CARRIER INJECTION CONTROL ELECTRODE LAYER AND DISPLAY PANEL WITH THE SAME

(71) Applicant: BOE Technology Group Co., Ltd., Beijing (CN)

(72) Inventors: Xiaohu Li, Beijing (CN); Lu Wang, Beijing (CN); Zhiqiang Jiao, Beijing (CN); Guangcai Yuan, Beijing (CN); Peng Wang, Beijing (CN); Liangliang Kang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 503 days.

(21) Appl. No.: 18/271,470

(22) PCT Filed: Feb. 25, 2022

(86) PCT No.: PCT/CN2022/077849
§ 371 (c)(1),
(2) Date: Jul. 10, 2023

(87) PCT Pub. No.: WO2023/159456
PCT Pub. Date: Aug. 31, 2023

(65) Prior Publication Data
US 2024/0397764 A1 Nov. 28, 2024

(51) Int. Cl.
*H10K 59/131* (2023.01)
*H10D 86/40* (2025.01)
(Continued)

(52) U.S. Cl.
CPC ....... *H10K 59/131* (2023.02); *H10K 59/1201* (2023.02); *H10K 59/1213* (2023.02);
(Continued)

(58) Field of Classification Search
CPC ............ H10K 59/131; H10K 59/1201; H10K 59/122; H10K 59/1213; H10K 59/80516; H10D 86/441; H10D 86/60
(Continued)

(56) References Cited

U.S. PATENT DOCUMENTS 9,252,384 B2 2/2016 Kim et al.
10,937,997 B2 3/2021 Tanaka
(Continued)

FOREIGN PATENT DOCUMENTS

CN 104241537 A 12/2014
CN 107112347 A 8/2017
(Continued)

OTHER PUBLICATIONS

International Search Report and Written Opinion issued Nov. 9, 2022, in corresponding International Application No. PCT/CN2022/077849.

*Primary Examiner* — Eric W Jones
(74) *Attorney, Agent, or Firm* — XSENSUS LLP

(57) ABSTRACT

The disclosure provides a display panel, a manufacturing method thereof and a display device, relating to a field of display technology. The display panel includes a base substrate, a driving layer and a light-emitting layer. The light-emitting units formed by the light-emitting layer includes a first electrode layer, a first insulating layer, a control electrode layer, a second insulating layer, an active layer, a second electrode layer, and an organic light-emitting layer sequentially distributed. In the embodiments of the present disclosure, the second insulating layer is configured to separate the control electrode layer from the organic light-emitting layer and the active layer.

20 Claims, 10 Drawing Sheets

(51) Int. Cl.

| | |
|---|---|
| ***H10D 86/60*** | (2025.01) |
| ***H10K 59/12*** | (2023.01) |
| ***H10K 59/121*** | (2023.01) |
| ***H10K 59/122*** | (2023.01) |
| ***H10K 59/80*** | (2023.01) |

(52) U.S. Cl.
CPC ..... *H10K 59/122* (2023.02); *H10K 59/80516* (2023.02); *H10D 86/441* (2025.01); *H10D 86/60* (2025.01)

(58) Field of Classification Search
USPC .......................... 257/40, 59, 88, 91, 99, 100
See application file for complete search history.

(56) References Cited

U.S. PATENT DOCUMENTS

| | | | | |
|---|---|---|---|---|
| 2009/0200931 A1* | 8/2009 | Takei | H10K 59/127 313/504 |
| 2014/0353607 A1* | 12/2014 | Kim | H10K 59/123 438/34 |
| 2014/0361256 A1 | 12/2014 | Kim et al. | |
| 2016/0111688 A1* | 4/2016 | Lee | H10K 71/00 438/34 |
| 2018/0012950 A1* | 1/2018 | Jung | H10K 59/126 |
| 2019/0189715 A1* | 6/2019 | Nendai | H10K 59/122 |
| 2020/0075897 A1* | 3/2020 | Tanaka | H10K 71/00 |
| 2020/0274108 A1 | 8/2020 | Tanaka | |
| 2021/0111380 A1 | 4/2021 | Tanaka | |
| 2021/0399024 A1* | 12/2021 | Gong | H10D 86/423 |

FOREIGN PATENT DOCUMENTS

| | | | |
|---|---|---|---|
| CN | 110880556 | A | 3/2020 |
| CN | 111613639 | A | 9/2020 |
| CN | 113571666 | A | 10/2021 |
| EP | 3 699 900 | A1 | 8/2020 |
| EP | 3 699 900 | B1 | 4/2022 |
| JP | 2005-243871 | A | 9/2005 |
| JP | 4561122 | B2 | 10/2010 |

* cited by examiner

DISPLAY DEVICE WITH CARRIER INJECTION CONTROL ELECTRODE LAYER AND DISPLAY PANEL WITH THE SAME

CROSS-REFERENCE

The present application is a U.S. National Stage of International Application No. PCT/CN2022/077849, filed on Feb. 25, 2022, the entire content of which is incorporated herein by reference for all purposes. No new matter has been introduced.

TECHNICAL FIELD

The present disclosure relates to a field of display technology, and more particularly, to a display panel, a manufacturing method thereof, and a display device.

BACKGROUND

With the development of display technology, OLED display panels have been widely used. During the application of the OLED display panels, the inventor found that some of the performance of the OLED display panels (such as display brightness and resolution) cannot meet requirements of some users, which have limited promotion of the OLED display panels.

It should be noted that the information disclosed in the above BACKGROUND section is only for enhancing the understanding of the background of the present disclosure, and thus may include information that does not constitute the prior art known to those of ordinary skill in the art.

SUMMARY

The present disclosure aims to provide a display panel, a manufacturing method thereof and a display device.

According to a first aspect of the present disclosure, a display panel is provided and includes:

a base substrate;

a driving layer, located on a side of the base substrate and provided with a plurality of pixel circuits, where the pixel circuits includes a first circuit and a second circuit, the first circuit is configured to input a first power signal, the second circuit is configured to input a second power signal;

a light-emitting layer, provided with a plurality of light-emitting units corresponding to the plurality of pixel circuits, where the light-emitting unit includes a first electrode layer, a first insulating layer, a control electrode layer, a second insulating layer, an active layer and a second electrode layer sequentially distributed on a side of the driving layer away from the base substrate, as well as an organic light-emitting layer located between the first electrode layer and the active layer;

where the first insulating layer is defined with a notch to expose a partial region of the first electrode layer, an orthographic projection of the control electrode layer on the first insulating layer is located at a region outside the notch, the second insulating layer is configured to separate the control electrode layer from the organic light-emitting layer and the active layer, the organic light-emitting layer is located in a region enclosed by the notch, an electronic injection capacity of the active layer is adjustable, the first electrode layer is electrically connected with the first circuit, and the second electrode layer is electrically connected with the second circuit.

According to any one of the display panels described in the present disclosure, where the first insulating layer is defined with a first accommodating groove with an opening facing towards the second insulating layer, an accommodating cavity is enclosed by the first accommodating groove and a surface of the second insulating layer close to the first insulating layer, and the control electrode layer is located in the accommodating cavity.

According to any one of the display panels described in the present disclosure, where the second insulating layer is defined with a second accommodating groove with an opening facing towards the first insulating layer, an accommodating cavity is enclosed by the second accommodating groove and a surface of the first insulating layer close to the second insulating layer, and the control electrode layer is located in the accommodating cavity.

According to any one of the display panels described in the present disclosure, where at least partial edge line of an orthographic projection of the first electrode layer on the driving layer is located in an orthographic projection of the first insulating layer on the driving layer, and the first insulating layer is defined with a via hole running through the driving layer, the control electrode layer is electrically connected with the second circuit through the via hole.

According to any one of the display panels described in the present disclosure, where the first insulating layer is provided with a plurality of via holes, and the control electrode layer is electrically connected with the second circuit through the plurality of via holes.

According to any one of the display panels described in the present disclosure, where a surface of the organic light-emitting layer away from the base substrate is lower than a surface of a portion of the control electrode layer close to the base substrate, and the portion of the control electrode layer is a portion of the control electrode layer orthogonally projected on the first electrode layer.

According to any one of the display panels described in the present disclosure, where the first insulating layer is defined with a plurality of first through holes arranged in an array to form the notch.

According to any one of the display panels described in the present disclosure, where the first through hole is a strip-shaped hole extending along a column direction, and the plurality of the first through holes are arranged at intervals along a row direction.

According to any one of the display panels described in the present disclosure, where the first through hole is a cylindrical hole or a prismatic hole.

According to any one of the display panels described in the present disclosure, where the light-emitting unit further includes a pixel defining layer:

where the pixel defining layer is located between the driving layer and the second electrode layer, and a surface of the pixel defining layer facing towards the second electrode layer is higher than a surface of the second insulating layer facing towards the second electrode layer;

the pixel defining layer is defined with a second through hole, and an orthographic projection of the notch on the driving layer is located in an orthographic projection of the second through hole on the driving layer.

According to any one of the display panels described in the present disclosure, where the surface of the pixel defining layer facing towards the second electrode layer is flush with a surface of the active layer facing towards the second electrode layer.

According to any one of the display panels described in the present disclosure, where the second insulating layer of the plurality of light-emitting units is an entire surface structure, and the pixel defining layer is located on a side of the second insulating layer close to the second electrode layer.

According to any one of the display panels described in the present disclosure, where the first insulating layer and the second insulating layer of the plurality of light-emitting units are arranged at intervals, and the first insulating layer and the second insulating layer are located in a region enclosed by the second through hole.

According to any one of the display panels described in the present disclosure, where the first circuit includes a plurality of adapter pieces distributed along a thickness direction of the driving layer, the plurality of adapter pieces are connected in series with an end electrically connected with the first electrode layer and the other end configured to input the first power signal;

the second circuit includes a driving transistor with a first electrode configured to input the second power signal and a second electrode electrically connected with the control electrode layer.

According to any one of the display panels described in the present disclosure, where the driving layer includes a routing layer, a buffer layer, a semiconductor layer, a first gate insulating layer, a first gate metal layer, a second gate insulating layer, a second gate metal layer, a dielectric insulating layer, a source-drain metal layer and a planarization layer sequentially distributed in a direction away from the base substrate:

the routing layer includes a first conductive line and the second conductive line, the semiconductor layer includes an active portion, the active portion includes a channel region, a first connection portion and a second connection portion, the first connection portion and the second connection portion are located on both sides of the channel region, the first gate metal layer includes a first adapter piece, and the source-drain metal layer includes a second adapter piece;

the first connection portion and the second connection portion form the first electrode and the second electrode of the driving transistor, respectively, the first connection portion is electrically connected with the second conductive line, and the second conductive line is configured to input the second power signal;

the first adapter piece is electrically connected with the first conductive line through a via hole running through the buffer layer and the first gate insulating layer, the second adapter piece and the first adapter piece are connected in series through a via hole running through the dielectric insulating layer and the second gate insulating layer, and the first electrode layer is electrically connected with the second adapter piece through a via hole running through the planarization layer.

According to any one of the display panels described in the present disclosure, where a material of the active layer is an organic semiconductor, and a surface of the active layer facing towards the second electrode layer is a plane.

According to any one of the display panels described in the present disclosure, where a material of the active layer is an n-type semiconductor.

According to a second aspect of the present disclosure, a manufacturing method of display panel is provided and includes:

providing a base substrate;

forming a driving layer including a plurality of pixel circuits on a side of the base substrate, where the pixel circuit includes a first circuit and a second circuit, the first circuit is configured to input a first power signal and the second circuit is configured to input a second power signal;

forming a light-emitting layer including a plurality of light-emitting units on a side of the driving layer away from the base substrate, where the plurality of light-emitting units correspond to the plurality of pixel circuits;

where the light-emitting unit includes a first electrode layer, a first insulating layer, a control electrode layer, a second insulating layer, an active layer and a second electrode layer sequentially distributed along a direction away from the base substrate, as well as an organic light-emitting layer located between the first electrode layer and the active layer;

where the first insulating layer is defined with a notch to expose a partial region of the first electrode layer, an orthographic projection of the control electrode layer on the first insulating layer is located in a region outside the notch, the second insulating layer is configured to separate the control electrode layer from the organic light-emitting layer and the active layer, the organic light-emitting layer is located in a region enclosed by the notch, an electronic injection capacity of the active layer is adjustable, the first electrode layer is electrically connected with the first circuit, and the second electrode layer is electrically connected with the second circuit.

According to a third aspect of the present disclosure, a display device is provided and includes the display panel of the above first aspect.

It should be noted that the above general description and the following detailed description are merely exemplary and explanatory and should not be construed as limitation to the present disclosure.

BRIEF DESCRIPTION OF THE DRAWINGS

The drawings here are incorporated into the specification and constitute a part of the specification, show embodiments in consistent with the present disclosure, and are configured together with the specification to explain principles of the present disclosure. Obviously, the drawings in the following description are only some embodiments of the present disclosure. For those of ordinary skill in the art, other drawings can be obtained based on these drawings without creative work.

REFERENCE NUMERALS

Figure 1:
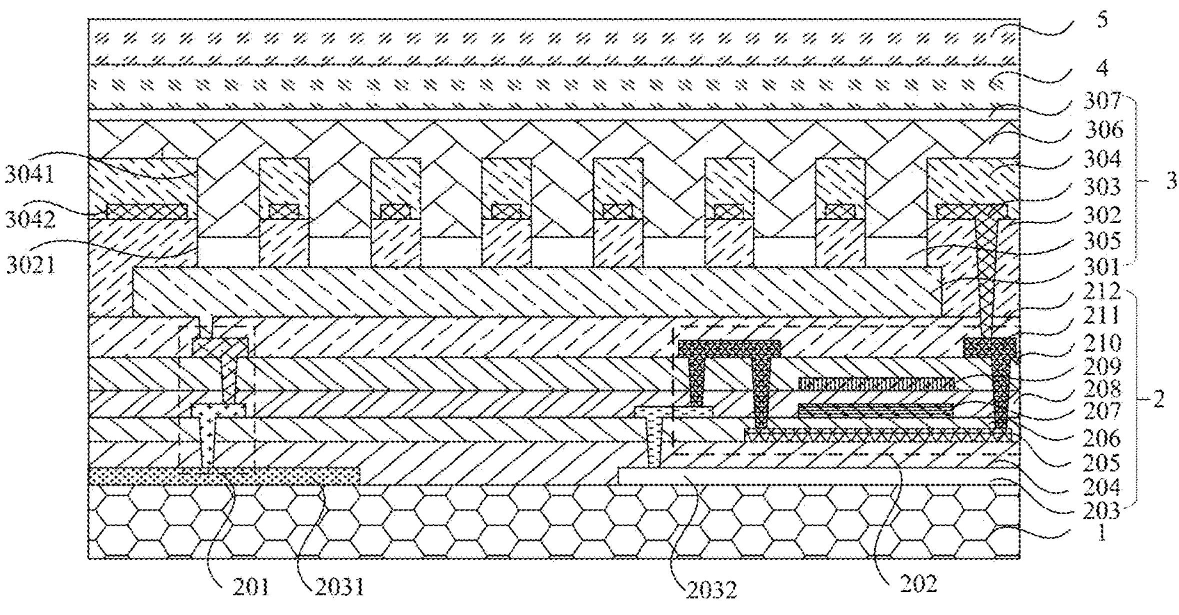
FIG. 1 is a structural diagram of a display panel provided by an embodiment of the present disclosure.

1. base substrate; 2. driving layer; 3. light-emitting layer; 4. light-extracting layer; 5. encapsulation layer;

201. first circuit; 202. second circuit; 203. routing layer; 204. buffer layer; 205. semiconductor layer; 206. first gate insulating layer; 207. first gate metal layer; 208. second gate insulating layer; 209. second gate metal layer; 210. dielectric insulating layer; 211. source-drain metal layer; 212. planarization layer;

2031. first conductive line; 2032. second conductive line;

301. first electrode layer; 302. first insulating layer; 303. control electrode layer; 304. second insulating layer; 305. organic light-emitting layer; 306. active layer; 307. second electrode layer; 308. pixel defining layer;

3021. first through hole; 3022. first accommodating groove; 3031. fourth through hole; 3041. third through hole; 3042. second accommodating groove; 3081. second through hole;

3051, hole injection layer; 3052, hole transport layer; 3053. electron barrier layer; 3054. organic material layer; 3055. hole barrier layer; 3056. electron transport layer; 3057. electron injection layer.

DETAILED DESCRIPTION

Example embodiments will now be described more fully with reference to the accompanying drawings. However, the example embodiments can be implemented in various forms and should not be construed as limited to the embodiments set forth herein; rather, these embodiments are provided such that this disclosure will be thorough and complete, and will fully convey the concept of the example embodiments to those skilled in the art. The same reference numerals in the drawings denote the same or similar structures, and thus their detailed descriptions will be omitted. In addition, the drawings are merely schematic illustrations of the disclosure and are not necessarily drawn to scale.

Although relative terms such as "above" and "below" are used in this specification to describe the relative relationship between one component illustrated in the drawings and another component, these terms are used in this specification for convenience only, for example, according to the illustrative direction depicted in the drawings. It can be understood that if the device illustrated in the drawings is inversed and turned upside down, the component described "above" would become the component "below". When a structure is "on" other structure(s), it may mean that the structure is integrally formed on the other structure(s), or that the structure is "directly" arranged on the other structure(s), or that the structure is "indirectly" arranged on other structure (s) through another structure.

The terms "a", "an", "the", "said" and "at least one" are used to indicate the presence of one or more elements/components/etc.; the terms "comprising" and "including" are used to indicate open-ended inclusive means, and means that there may be additional elements/components/etc., in addition to the listed elements/components/etc.; and the terms such as "first", "second" and "third" and are only used as markers, not to limit the number of objects.

The transistor involved in embodiments of the present disclosure may be a thin film transistor or a field effect transistor or other device with the same characteristics. Taking transistor as an example, a transistor refers to an element that at least includes three terminals, namely, a control electrode, a first electrode and a second electrode. The transistor is defined with a channel region between the first electrode and the second electrode, and a current may flow through the first electrode, the channel region and the second electrode. The channel region refers to a region that the current mainly flows through. The first electrode is a source electrode, the second electrode is a drain electrode, or the first electrode is a drain electrode, and the second electrode is a source electrode. In cases that transistors with opposite polarities are used, a current direction changes during operation of a circuit, or the like, functions o of the "first electrode" and the "second electrode" are sometimes interchangeable.

Figure 2:
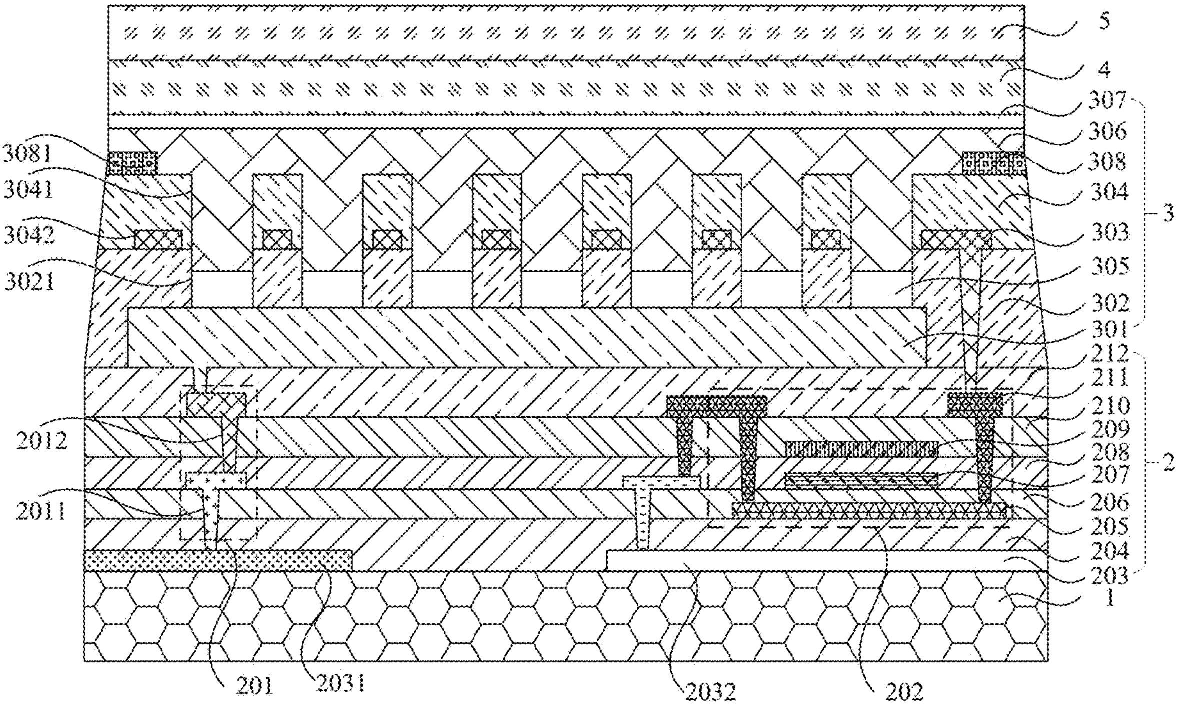
FIG. 2 is a structural diagram of another display panel provided by an embodiment of the present disclosure.

Embodiments of the present disclosure provide a display panel using an OLET backplane. As shown in FIG. 1 or FIG. 2, the display panel includes: a base substrate 1, a driving layer 2 and a light-emitting layer 3. The driving layer 2 is located on a side of the base substrate 1, and the light-emitting layer 3 is located on a side of the driving layer 2 away from the base substrate 1. The driving layer 2 is formed with a plurality of pixel circuits, and the light-emitting layer 3 is formed with a plurality of light-emitting units corresponding to the plurality of pixel circuits. Each pixel circuit is configured to drive a corresponding light-emitting unit to emit light.

In addition, as shown in FIG. 1 or FIG. 2, the display panel further includes a light-extracting layer 4 and an encapsulation layer 5. The light-extracting layer 4 is located on a side of the light-emitting layer 3 away from the driving layer 2. The encapsulation layer 5 is configured to encapsulate the light-extracting layer 4 and the light-emitting layer 3 to avoid the formation of a water-oxygen channel which is immersed in the light-emitting layer 3, thus achieving the protection of the light-extracting layer 4 and the light-emitting layer 3. For a bottom-emission display panel, the included light-extracting layer 4 may be omitted, and that is, only the encapsulation layer 5 is provided on the side of the light-emitting layer 3 away from the base substrate 1.

A pixel circuit and a corresponding light-emitting unit are explained as follows.

As shown in FIG. 1 or FIG. 2, the pixel circuit includes a first circuit 201 and a second circuit 202, the first circuit 201 is configured to input a first power signal and the second circuit 202 is configured to input a second power signal; the light-emitting unit includes a first electrode layer 301, a first insulating layer 302, a control electrode layer 303, a second insulating layer 304, an active layer 306 and a second electrode layer 307 sequentially distributed on a side of the driving layer away from the base substrate 1, as well as an organic light-emitting layer 305 located between the first electrode layer 301 and the active layer 306.

The first insulating layer 302 is defined with a notch to expose a partial region of the first electrode layer 301, an orthographic projection of the control electrode layer 303 on the first insulating layer 302 is located at a region outside the notch, the second insulating layer 304 is configured to separate the control electrode layer 303 from the organic light-emitting layer 305 and the active layer 306, the organic light-emitting layer 305 is located in a region enclosed by the notch, an electronic injection capacity of the active layer 306 is adjustable, the first electrode layer 301 is electrically connected with the first circuit 201, and the second electrode layer 307 is electrically connected with the second circuit 202.

In the related art, the control electrode layer 303 is located on a side of the first electrode layer 301 close to the driving layer 2. In this way, when the control electrode layer 303 is loaded with a voltage to adjust the electronic injection capacity of the active layer 306, in order to avoid the influence on the first electrode layer 301, the selection of a material of the first electrode layer 301 is limited, which also makes the manufacturing process of the control electrode layer 303 and the first electrode layer 301 more difficult. In the embodiment of the present disclosure, the control electrode layer 303 is located between the first electrode layer 301 and the active layer 306, which avoids the influence on the first electrode layer 301 when the control electrode layer 303 is loaded with the voltage to adjust the electronic injection capacity of the active layer 306, thus avoiding the limitation of the selection of the material of the first electrode layer 301, and simplifying the manufacturing process of the display panel. In addition, it is easier to adjust the electronic injection capacity of the active layer 306 by an electric field formed between the control electrode layer 303 and the second electrode layer 307, which improves the efficiency of the active layer 306.

The base substrate 1 is a glass base substrate or a plastic base substrate. When the display panel is a bottom-emission display panel, the base substrate 1 is a transparent base substrate. When the display panel is a top-emission display panel, the base substrate 1 may be an opaque base substrate in addition to the transparent base substrate.

Figure 3:
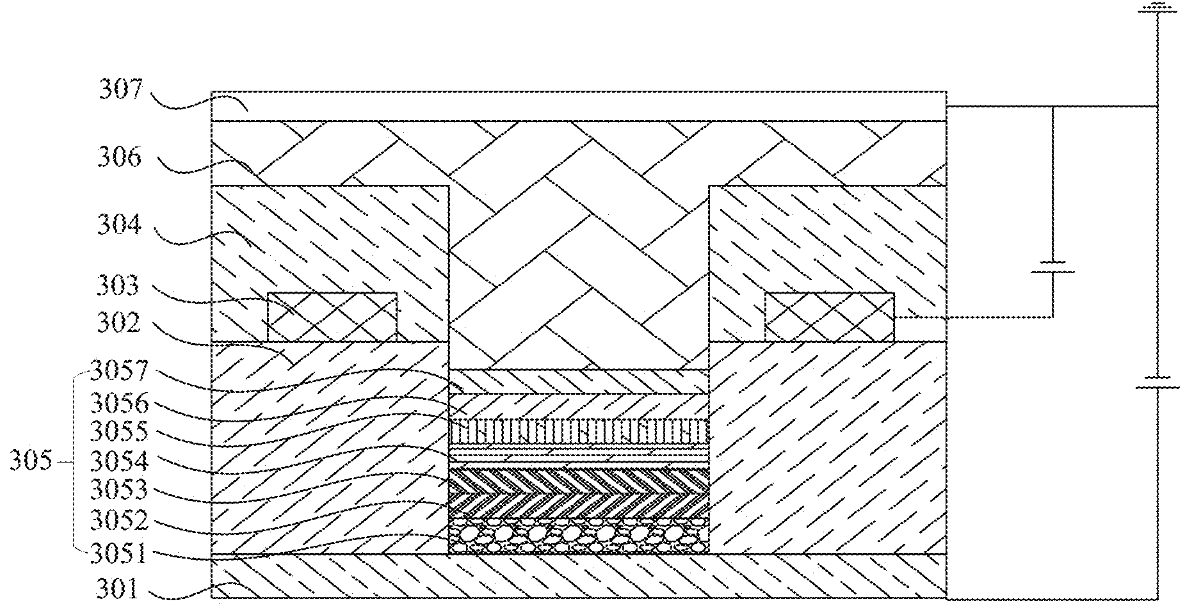
FIG. 3 is a circuit connection diagram of a light-emitting layer provided by an embodiment of the present disclosure.
Figure 4:
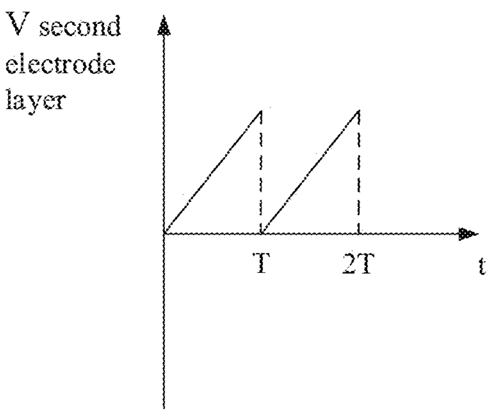
FIG. 4 is a voltage change diagram of a control electrode layer provided by an embodiment of the present disclosure.
Figure 5:
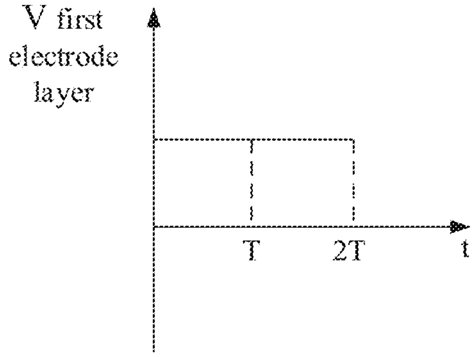
FIG. 5 is a voltage change diagram of a first electrode layer provided by an embodiment of the present disclosure.
Figure 6:
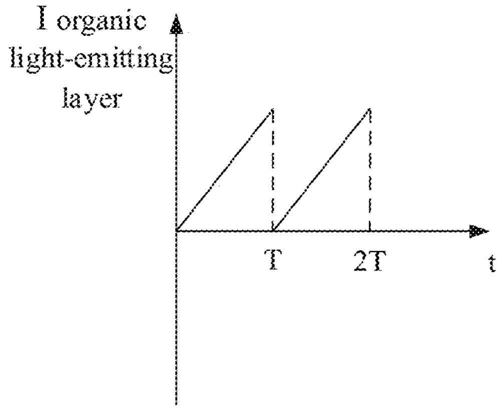
FIG. 6 is a current change diagram of an organic light-emitting layer provided by an embodiment of the present disclosure.

In some embodiments, during the organic light-emitting layer 305 emits light, the first power signal is a constant voltage value, and the second power signal is an adjustable voltage value. The circuit connection among the first electrode layer 301, the control electrode layer 303 and the second electrode layer 307 included in the light-emitting layer 3 is shown in FIG. 3, the first power signal received by the control electrode layer 303 is shown in FIG. 4, the second power signal received by the first electrode layer 301 is shown in FIG. 5, and at this time, a current signal leading the organic light-emitting layer 305 to emit light is shown in FIG. 6. Thus, in case that the second power signal is constant, the current signal leading the organic light-emitting layer 305 to emit light increases with the increase of the first power signal, so as to achieve the adjustment of brightness when the organic light-emitting layer 305 emits light.

Of course, the second power signal may also be a constant voltage value. Thus, the second circuit has a function of adjusting a size of the second power signal, so as to control the voltage value loaded on the control electrode layer.

As shown in FIG. 3, the organic light-emitting layer 305 includes a hole injection layer 3051, a hole transport layer 3052, an electron barrier layer 3053, an organic material layer 3054, a hole barrier layer 3055, an electron transport layer 3056 and an electron injection layer 3057, which are sequentially distributed along a direction from the first electrode layer 301 to the second electrode layer 307. Of course, the organic light-emitting layer 305 may also only include the organic material layer 3054 and other part of film layers, which are not limited in the embodiments of the present disclosure. Since the active layer 306 has characteristic of adjustable electronic injection capacity, the electron injection layer 3057 included in the organic light-emitting layer 305 may be omitted. The organic material layer 3054 is a red organic material layer, a blue organic material layer or a green organic material layer.

In the embodiment of the present disclosure, the driving layer 2 is an OLET (Organic Light Emitting Transistor) driving layer, such as a VOLET (Vertical Organic Light Emitting Transistor) driving layer.

In some embodiments, for the first circuit 201 included in the pixel circuit, the first circuit 201 includes a plurality of adapter pieces distributed along a thickness direction of the driving layer 2. The plurality of adapter pieces are connected in series, an end of the series is electrically connected with the first electrode layer 301, and the other end of the series is configured to input the first power signal. Of course, the first circuit 201 may also be a switch transistor in addition to the plurality of adapter pieces, which is not limited in the embodiments of the present disclosure.

In some embodiments, for the second circuit 202 included in the pixel circuit, the second circuit 202 includes a driving transistor with a first electrode configured to input the second power signal and a second electrode electrically connected with the control electrode layer 303.

Since the second circuit 202 of each pixel circuit only includes a driving transistor, the pixel circuit is simplified. Thus, the blocking of the light beam (especially for the bottom-emission display panel) may be reduced, and an opening rate may be increased, thereby improving the brightness of the display panel. In addition, due to the simplification of the pixel circuit, more pixel circuits may be arranged per unit area, and a number of the light-emitting units may be correspondingly increased, thus improving the resolution of the display panel.

In some embodiments, as shown in FIG. 1 or FIG. 2, the driving layer 2 includes a routing layer 203, a buffer layer 204, a semiconductor layer 205, a first gate insulating layer 206, a first gate metal layer 207, a second gate insulating layer 208, a second gate metal layer 209, a dielectric insulating layer 210, a source-drain metal layer 211 and a planarization layer 212, which are sequentially distributed in a direction away from the base substrate 1. The routing layer 203 includes a first conductive line 2031 and a second conductive line 2032, the semiconductor layer 205 includes an active portion, the active portion includes a channel region, a first connection portion and a second connection portion, the first connection portion and the second connection portion are located on both sides of the channel region, the first gate metal layer 207 includes the first adapter piece, and the source-drain metal layer 211 includes the second adapter piece.

The first connection portion and the second connection portion form the first electrode and the second electrode of the driving transistor, respectively, the first connection portion is electrically connected with the second conductive line 2032, and the second conductive line 2032 is configured to input the second power signal. The first adapter piece is electrically connected with the first conductive line through a via hole running through the buffer layer 204 and the first gate insulating layer 206, the second adapter piece and the first adapter piece are connected in series through a via hole running through the dielectric insulating layer 210 and the second gate insulating layer 208, and the first electrode layer 301 is electrically connected with the second adapter piece through a via hole running through the planarization layer 212.

The first gate metal layer 207 includes a first conductive portion. The first conductive portion and the channel region of the active portion overlap at an overlapping region in a thickness direction of the driving layer 2. The overlapping region on the first conductive portion overlapping with the channel region forms a control electrode of the driving transistor. In this way, a control signal may be input to the control electrode of the driving transistor to control the disconnection or conduction between the first electrode and the second electrode of the driving transistor.

Of course, the control signal may also control the degree of conduction after the first and second electrodes of the driving transistor are in conduction. In this way, the second power signal input to the first electrode of the driving transistor may also be a constant voltage, so as to adjust the voltage value loaded on the control electrode layer through the degree of conduction of the driving transistor, which is not limited in the embodiments of the present disclosure.

In some embodiments, the source-drain metal layer includes a first connection line and a second connection line, the first connection line is electrically connected with the control electrode layer 303 and the second connection portion through a via hole, the first gate metal layer 207 includes a third connection line, the second connection line is electrically connected with the first connection portion and the third connection line through a via hole, and the third connection line is electrically connected with the second conductive line 2032 through a via hole. Of course, it may also be that the first connection portion is directly connected with the second conductive line 2032 through a via hole, which is not limited in the embodiment of the present disclosure.

In some embodiments, the second gate metal layer 209 includes a second conductive portion. The first conductive portion and the second conductive portion overlap at an overlapping region in a thickness direction of the driving layer 2. Parts of the first conductive portion and the second conductive portion corresponding to the overlapping region form an interlayer capacitance, so as to achieve voltage storage.

In the embodiment of the present disclosure, the structure of the driving layer 2 may be another structure besides the structure described in the above embodiments. For details, reference may be made to the related art, which is not limited in the embodiment of the present disclosure. For example, the difference from the structure described above is that the second gate metal layer 209 and the second gate insulating layer 208 are missing from the driving layer 2, that is, the driving layer 2 includes the routing layer 203, the buffer layer 204, the semiconductor layer 205, the first gate insulating layer 206, the first gate metal layer 207, the dielectric insulating layer 210, the source-drain metal layer 211 and the planarization layer 212.

In the embodiment of the present disclosure, for the first electrode layer 301 included in the light-emitting layer 3, when adjusting the electronic injection capacity of the active layer 306, the influence on the first electrode layer 301 is avoided, such that the selection of the material of the first electrode layer 301 is not limited. The first electrode layer 301 is a conductive oxide film layer. For example, the first electrode layer 301 is an IZO film layer and an ITO film layer.

For other part of the film layers included in the light-emitting layer 3, in some embodiments, the first insulating layer 302 is an inorganic film layer, such as, a SiO film layer and a SIN film layer, and a thickness of the film layer is greater than or equal to 10 nm and less than or equal to 200 nm. The control electrode layer 303 is a conductive oxide film, such as, an IZO film layer and an ITO film layer, and a thickness of the film layer is greater than or equal to 10 nm and less than or equal to 200 nm. The second insulating layer 304 is an inorganic film layer, such as a SiO film layer, a SiN film layer and an $Al_2O_3$ film layer, the film layer may be a single layer structure or a composite layer structure, and a thickness of the film layer is greater than or equal to 5 nm and less than or equal to 200 nm. The active layer 306 is an organic semiconductor film layer, i.e., an electron-dominantly conductive film layer made of the organic semiconductor, and a thickness of the film layer may be greater than or equal to 10 nm and less than or equal to 5 microns.

Of course, for the active layer 306, in addition to being an organic semiconductor film layer, it may also be an inorganic semiconductor film layer, i.e., an electron-dominantly conductive film layer made of the inorganic semiconductor. When the active layer 306 is the organic semiconductor film layer, a surface of the active layer 306 facing towards the second electrode layer 307 is a plane. The plane described here is not a flat surface in the strict sense, rather, it only characterizes that the surface the active layer 306 facing towards the second electrode layer 307 has a relatively less curvature. In the embodiment of the present disclosure, the active layer 306 may be made of an n-type semiconductor. For example, the active layer 306 is a C60 film layer, a C60 composite film layer, and the like.

In the embodiment of the present disclosure, the first insulating layer 302, the second insulating layer 304 and the active layer 306 of the plurality of light-emitting units are all corresponding to an entire surface structure. For example, the first insulating layer 302 of the plurality of light-emitting units is an entire surface structure, the second insulating layer 304 of the plurality of light-emitting units is an entire surface structure, and the active layer of the plurality of light-emitting units is an entire surface structure. Of course, each light-emitting unit may also include a first insulating layer 302, a second insulating layer 304, and an active layer 306 that are independent, and that is, the first insulating layer 302, the second insulating layer 304, and the active layer 306 of the plurality of light-emitting units are arranged at intervals, which is not limited in the embodiment of the present disclosure.

The first electrode layer 301 and the control electrode layer 303 included in the plurality of light-emitting units are arranged at intervals to facilitate the independent control after each light-emitting unit is in conduction with the corresponding first circuit 201 and the second circuit 202. The second electrode layer 307 of the plurality of light-emitting units may be constructed on an entire surface structure so as to serve as a common electrode of the plurality of light-emitting units.

In the embodiment of the present disclosure, the second insulating layer 304 is configured to separate the control electrode layer 303 from the organic light-emitting layer 305 and the active layer 306, so as to achieve the insulation of the control electrode layer 303 from the organic light-emitting layer 305 and the active layer 306. For example, the first insulating layer 302 and the second insulating layer 304 wrap the control electrode layer 303, and that is, the first insulating layer 302 and the second insulating layer 304 may form an accommodating cavity, and the control electrode layer 303 is located in the accommodating cavity, thus achieving the insulation of the control electrode layer 303 from the active layer 306 and the organic light-emitting layer 305.

Figure 7:
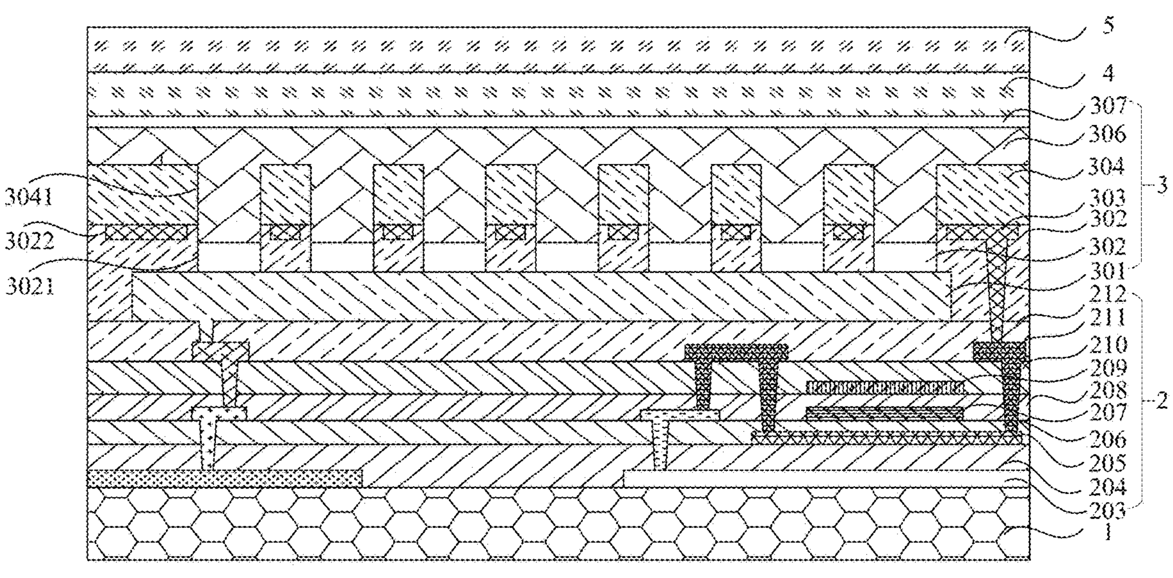
FIG. 7 is a structural diagram of another display panel provided by an embodiment of the present disclosure.

In order to achieve the wrapping of the control electrode layer 303, as shown in FIG. 7, the first insulating layer 302 is defined with a first accommodating groove 3022 with an opening facing towards the second insulating layer 304, an accommodating cavity is enclosed by the first accommodating groove 3022 and a surface of the first insulating layer 302 close to the second insulating layer 304, and the control electrode layer 303 is located in the accommodating cavity, or, as shown in FIG. 1 or 2, the second insulating layer 304 is defined with a second accommodating groove 3042 with an opening facing towards the first insulating layer 302, an accommodating cavity is enclosed by the second accommodating groove 3042 and a surface of the first insulating layer 302 close to the second insulating layer 304, and the control electrode layer 303 is located in the accommodating cavity.

When the first accommodating groove 3022 is defined on the first insulating layer 302, it may avoid increasing an overall thickness of the display panel due to the arrangement of the control electrode layer 303.

Of course, in addition to the above two manners to achieve the wrapping of the control electrode layer 303, it may also be that the first insulating layer 302 is defined with a first accommodating groove 3022 with an opening facing towards the second insulating layer 304, the second insulating layer 304 is defined with a second accommodating groove 3042 with an opening facing towards the first insulating layer 302, and a groove size of the first accommodating groove 3022 is smaller than a groove size of the second accommodating groove 3042. In this way, after the second insulating layer 304 is formed on a side of the first insulating layer 302 away from the driving layer 2, an accommodating cavity is formed by the closing of the first accommodating groove 3022 and the second accommodating groove 3042.

After the control electrode layer 303 is sealed in the accommodating cavity, in order to avoid the isolation of the accommodating cavity when the control electrode layer 303 is loaded with voltage and thus reduce the adjustment of the active layer 306, a wall thickness of the accommodating cavity is greater than or equal to 50 nm and less than or equal to 1000 nm.

Figure 8:
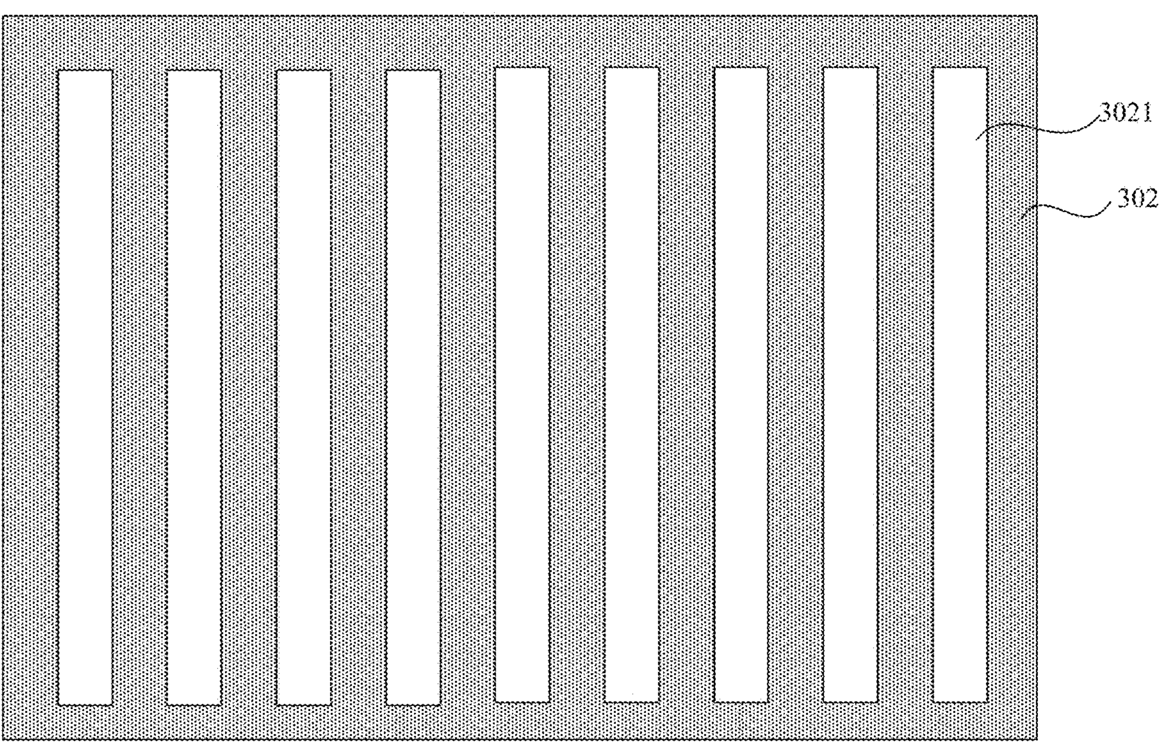
FIG. 8 is a schematic diagram from a top view of a first insulating layer provided by an embodiment of the present disclosure.
Figure 9:
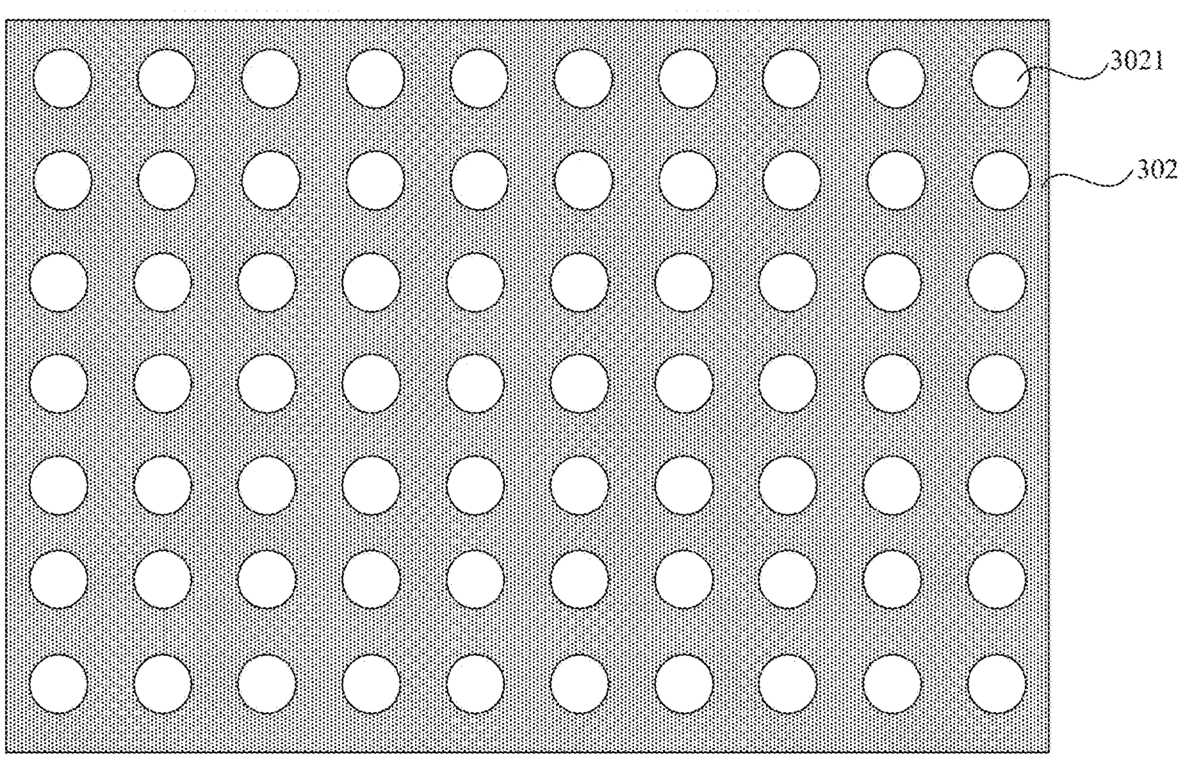
FIG. 9 is a schematic diagram from a top view of another first insulating layer provided by an embodiment of the present disclosure.

In the embodiment of the present disclosure, for the notch of the first insulating layer 302, as shown in FIG. 8 or FIG. 9, the first insulating layer 302 is defined with a plurality of first through holes 3021 arranged in an array to form a notch. The plurality of first through holes 3021 distributed in the array may ensure the uniformity of the distribution of the organic light-emitting layer 305, thus ensuring the uniformity of the display brightness of the display panel.

As shown in FIG. 8, the first through hole 3021 includes two side walls extending in a column direction and two end walls at ends. That is, the first through hole 3021 is a strip-shaped hole extending along a column direction, and a plurality of first through holes 3021 are arranged at intervals along a row direction. Of course, as shown in FIG. 9, the first through hole 3021 is a cylindrical hole, or the first through hole 3021 is a prismatic hole. When the first through hole 3021 is a cylindrical hole or a prismatic hole, sum of cross-sectional areas of the plurality of first through holes 3021 may be appropriately increased, thereby increasing an area of the organic light-emitting unit.

When the first insulating layer 302 is defined with a plurality of first through holes 3021, the corresponding second insulating layer 304 is defined with a plurality of third through holes 3041 corresponding to the plurality of first through holes 3021. An aperture of the third through hole 3041 is greater than or equal to an aperture of the corresponding first through hole 3021, and that is, an orthographic projection of the third through hole 3041 on the driving layer 2 covers an orthographic projection of the first through hole 3021 on the driving layer 2. Of course, it may also be that an aperture of the third through hole 3041 is smaller than an aperture of the corresponding first through hole 3021, and that is, an orthographic projection of the third through hole 3041 on the driving layer 2 is located in an orthographic projection of the first through hole 3021 on the driving layer 2, which is not limited in the embodiment of the present disclosure as long as it is convenient for the subsequent manufacture of the organic light-emitting layer 305 and the achievement of the insulation of the control electrode layer 303 from the organic light-emitting layer 305 and the active layer 306.

In addition, the third through hole 3041 corresponds to the first through hole 3021, and thus, the arrangement of the third through holes 3041 of the second insulating layer 304 and a shape of each third through hole 3041 may refer to the first through hole 3021, which will not be repeated in the embodiment of the present disclosure.

Figure 10:
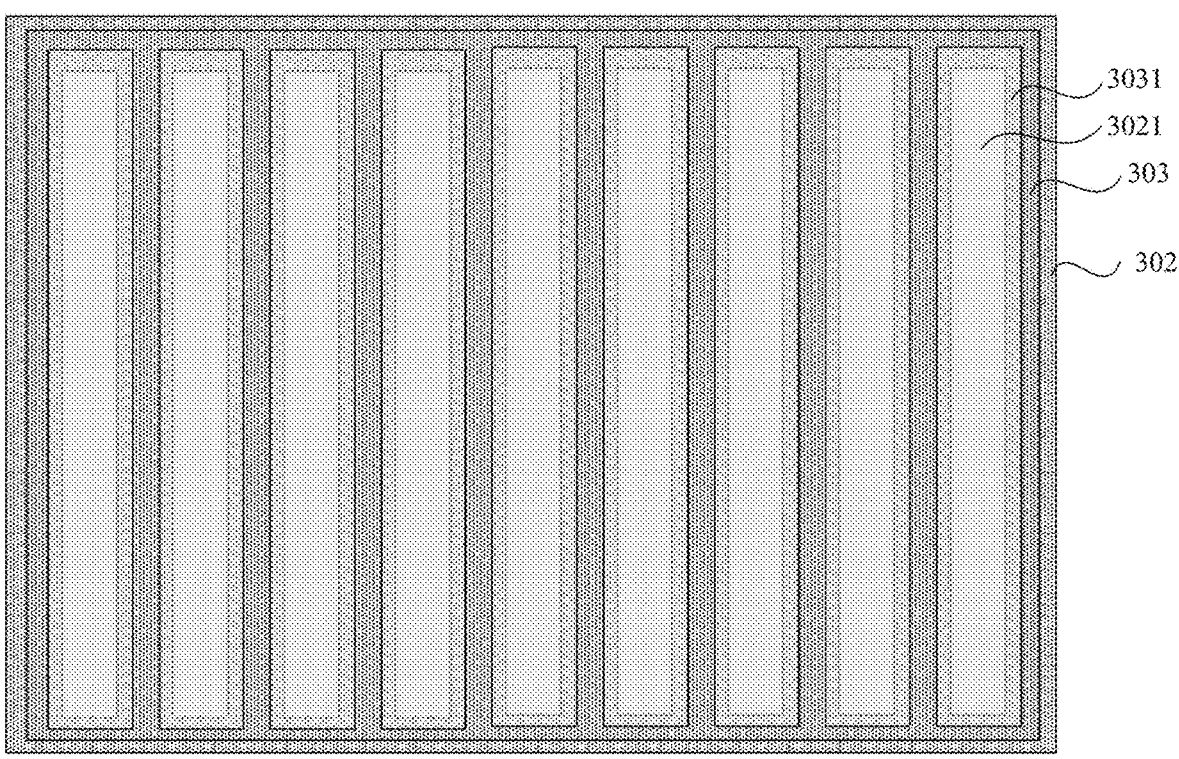
FIG. 10 is a schematic diagram of a stacked structure of a first insulating layer and a second electrode layer provided by an embodiment of the present disclosure.

In order to ensure that the control electrode layer 303 is wrapped by the first insulating layer 302 and the second insulating layer 304, in combination with the above, an orthographic projection of the control electrode layer 303 on the first insulating layer 302 is located in a region outside the notch, and thus the control electrode layer 303 may be defined with fourth through holes 3031 corresponding to the plurality of first through holes 3021, and an orthographic projection of the first through hole 3021 on the first electrode layer 301 is located in an orthographic projection of the fourth through hole 3031 on the first electrode layer 301, and an edge of the orthographic projection of the first through hole 3021 does not extend to an edge of the orthographic projection of the fourth through hole 3031. For example, the structure of the control electrode layer 303 is shown in FIG. 10.

Of course, in addition to the control electrode layer 303 being defined with the plurality of fourth through holes 3031 corresponding to the plurality of first through holes 3021, it may also be that a number of fourth through holes 3031 of the control electrode layer 303 is less than a number of first through holes 3021, which is not limited in the embodiment of the present disclosure as long as the control electrode layer 303 is wrapped by the first insulating layer 302 and the second insulating layer 304.

In the embodiment of the present disclosure, since the second circuit 202 is formed in the driving layer 2, in order to achieve the electrical connection between the control electrode layer 303 and the second circuit 202, a via hole running through the driving layer 2 may be provided. In combination with the above, when the second circuit 202 includes the driving transistor, a first connection line of the source-drain metal layer 211 is electrically connected with the control electrode layer 303.

In some embodiments, a via hole through the first insulating layer 302, the first electrode layer 301 and the planarization layer to the source-drain metal layer may be provided, so as to achieve the electrical connection between the control electrode layer 303 and the first connection line.

In order to avoid the conduction of the control electrode layer 303, the first connection line and the first electrode layer 301, a via hole may be defined on the first electrode layer 301, and the via hole may be filled when the first insulating layer 302 is manufactured. After complete the manufacture of the first insulating layer 302, the via hole running through the source-drain metal layer 211 may be provided to achieve the insulation between the via hole and the first electrode layer 301, and the control electrode layer 303 may be manufactured afterwards. Thus, it may achieve the electrical connection between the control electrode layer 303 and the second connection line of the source-drain metal layer 211, and achieve the insulation with the first electrode layer 301.

In some other embodiments, as shown in FIG. 1 or FIG. 2, at least partial edge line of an orthographic projection of the first electrode layer 301 on the driving layer 2 is located in an orthographic projection of the first insulating layer 302 on the driving layer 2, and the first insulating layer 302 is defined with a via hole running through the driving layer 2, the control electrode layer 303 is electrically connected with the second circuit 202 through the via hole. In this way, the manufacturing process of the light-emitting layer 3 may be simplified on the basis of ensuring the electrical connection between the control electrode layer 303 and the second circuit 202.

At least partial edge line of an orthographic projection of the first electrode layer 301 on the driving layer 2 is located in an orthographic projection of the first insulating layer 302 on the driving layer 2, that is, at least a part of the edge of the first insulating layer 302 extends out of the first electrode layer 301 to cover the surface of the driving layer 2. For example, the first insulating layer 302 completely covers the side of the first electrode layer 301, or the first insulating layer 302 partially covers the side of the first electrode layer 301. Thus, a via hole may be defined at a portion of the first insulating layer 302 extending out of the first electrode layer 301, such that the via hole may avoid the first electrode layer 301.

In combination with the above, the control electrode layer 303 is electrically connected with the first connection line in the source-drain metal layer 211 included in the driving layer 2. The via hole defined in the extension portion of the first insulating layer 302 may run through to the source-drain metal layer 211 to achieve the electrical connection between the control electrode layer 303 and the first connection line.

In order to avoid the attenuation of the voltage loaded on the control electrode layer 303 with the extension of the transmission path, there may be a plurality of electrical connection paths between the control electrode layer 303 and the second circuit 202. For example, for a second implementation manner described above, the first insulating layer 302 is defined with a plurality of via holes, and the control electrode layer 303 is electrically connected with the second circuit 202 through the plurality of via holes. That is, the portion of the first insulating layer 302 extending out of the first electrode layer 301 is defined with a plurality of via holes, such that the transmission of the first power signal is achieved through the plurality of via holes, ensuring the uniformity of the voltage loaded on the control electrode layer 303.

In the embodiment of the present disclosure, after the voltage is applied to the control electrode layer 303, an electric field forms between the control electrode layer 303 and the second electrode layer 307. In order to expand the influence region of the electric field on the active layer and improve the adjustment effect of the active layer, as shown in FIG. 1 or FIG. 2, a surface of the organic light-emitting layer 305 away from the base substrate 1 is lower than a surface of a portion of the control electrode layer 303 close to the base substrate 1, and the portion of the control electrode layer 303 is a portion of the control electrode layer 303 orthogonally projected on the first electrode layer 301. That is, a distance from a surface on the control electrode layer 303 facing towards the first electrode layer 301 and parallel to the first electrode layer 301 to the first electrode layer 301 is greater than a thickness of the organic light-emitting layer 305.

Figure 11:
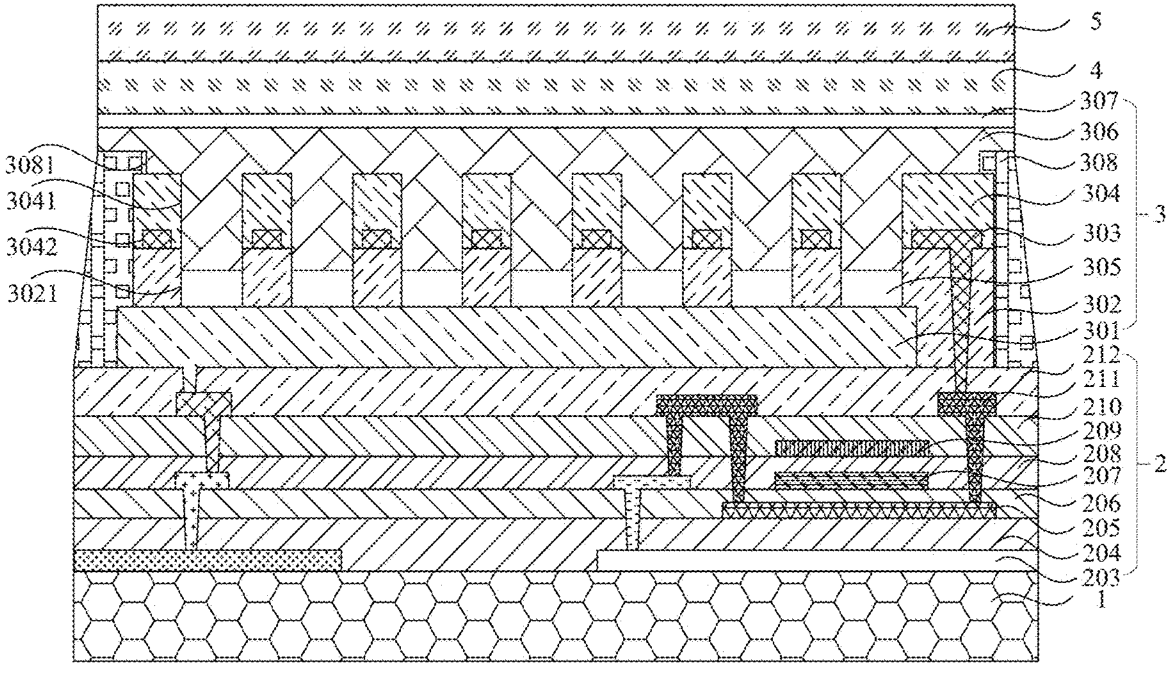
FIG. 11 is a structural diagram of yet another display panel provided by an embodiment of the present disclosure.

In the embodiment of the present disclosure, since the organic light-emitting layer 305 is in the region enclosed by the notch of the first insulating layer 302, the second insulating layer 304 may be reused as the pixel defining layer 308. Of course, in some embodiments, as shown in FIG. 2 or FIG. 11, the light-emitting layer 3 may further include a pixel defining layer 308. Thus, the clarity of the definition of the organic light-emitting layer 305 may be further ensured through the pixel defining layer 308.

When the light-emitting layer 3 includes a pixel defining layer 308, the pixel defining layer 308 is located between the driving layer 2 and the second electrode layer 307, a surface of the pixel defining layer 308 facing towards the second electrode layer 307 is higher than a surface of the second insulating layer 304 facing towards the second electrode layer 307, the pixel defining layer 308 is defined with a second through hole 3081, and an orthographic projection of the notch on the driving layer 2 is located in an orthographic projection of the second through hole 3081 on the driving layer 2.

In combination with the structure of the second insulating layer 304 described above, the second insulating layer 304 of the plurality of light-emitting units is the entire surface structure. The pixel defining layer 308 is located between the second insulating layer 304 and the active layer 306, that is, as shown in FIG. 2, the pixel defining layer 308 is formed on a surface of the second insulating layer 304 away from the driving layer 2. When the first insulating layer 302 and the second insulating layer 304 of the plurality of light-emitting units are arranged at intervals, as shown in FIG. 11, the first insulating layer 302 and the second insulating layer 304 are located in the region enclosed by the second through hole 3081 of the pixel defining layer 308, that is, the pixel defining layer 308 is formed on a surface of the driving layer 2 away from the base substrate 1, and surrounds the first insulating layer 302 and the second insulating layer 304. Of course, the pixel defining layer 308 may also be formed in other structures, which is not limited in the embodiment of the present disclosure. For example, the first insulating layer

302 of the plurality of light-emitting units is the entire surface structure, and the second insulating layers 304 of the plurality of light-emitting units are arranged at intervals, and the pixel defining layer 308 is formed on a surface of the first insulating layer 302 away from the base substrate 1.

It should be noted that when the display panel includes the pixel defining layer 308, an upper surface of the pixel defining layer 308 (facing towards a surface of the second electrode layer 307) may be flush with an upper surface of the active layer 306 (facing towards a surface of the second electrode layer 307), and the second electrode layer 307 is directly supported on the pixel defining layer 308 and the active layer 306. Of course, the upper surface of the pixel defining layer 308 may also be lower than the upper surface of the active layer 306, and thus the active layer 306 covers the upper surface of the pixel defining layer 308, and the second electrode layer 307 is directly supported on the active layer 306, which is not limited in the embodiment of the present disclosure.

The embodiments of the present disclosure provides a manufacturing method of display panel, which is used for manufacturing the display panel described in the above embodiments. The method includes the following steps S110 to S130.

step S110: a base substrate is provided;

step S120: a driving layer including a plurality of pixel circuits is formed on a side of the base substrate, where the pixel circuit includes a first circuit and a second circuit, the first circuit is configured to input a first power signal and the second circuit is configured to input a second power signal;

step S130: a light-emitting layer including a plurality of light-emitting units is formed on a side of the driving layer away from the base substrate, where the plurality of light-emitting units correspond to the plurality of pixel circuits;

where the light-emitting unit includes a first electrode layer, a first insulating layer, a control electrode layer, a second insulating layer, an active layer and a second electrode layer sequentially distributed along a direction away from the base substrate, as well as an organic light-emitting layer located between the first electrode layer and the active layer;

the first insulating layer is defined with a notch to expose a partial region of the first electrode layer, an orthographic projection of the control electrode layer on the first insulating layer is located in a region outside the notch, the second insulating layer is configured to separate the control electrode layer from the organic light-emitting layer and the active layer, the organic light-emitting layer is located in a region enclosed by the notch, an electronic injection capacity of the active layer is adjustable, the first electrode layer is electrically connected with the first circuit, and the second electrode layer is electrically connected with the second circuit.

The manufacturing process of the above step S120 may be combined with the specific structure of the driving layer described in the above embodiment to refer to the relevant technology, which will not be repeated in the embodiment of the present disclosure. The manufacturing process of the above step S130 may be achieved in the following manner.

Figure 12:
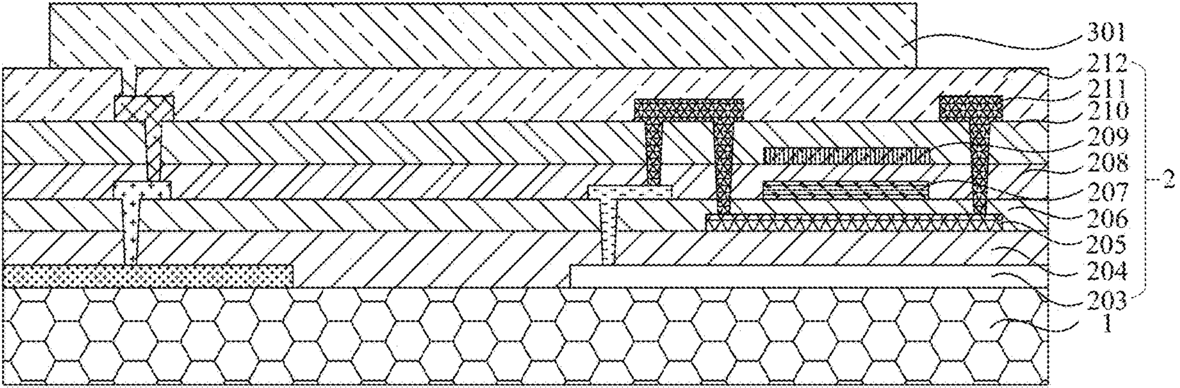
FIG. 12 is a structural diagram for forming a first electrode layer provided by an embodiment of the present disclosure.
Figure 13:
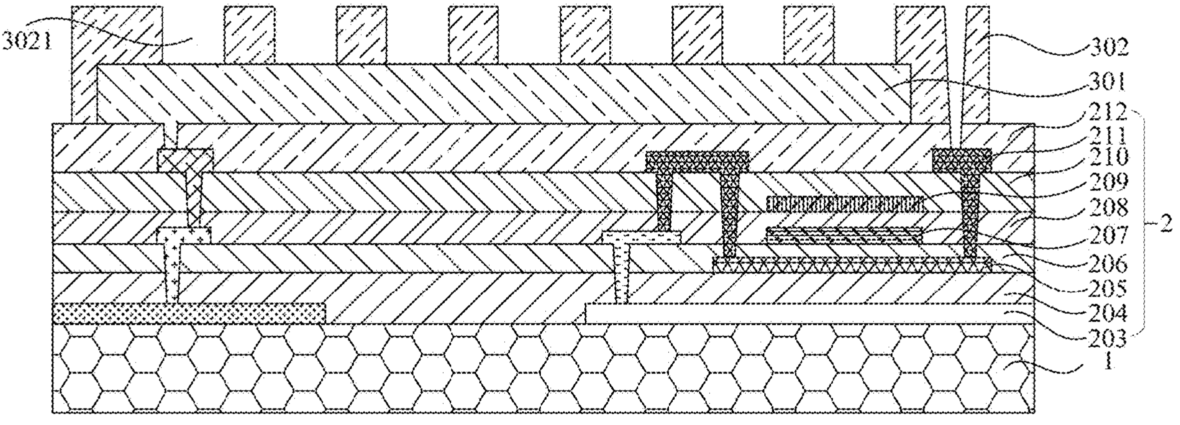
FIG. 13 is a structural diagram for forming a first insulating layer provided by an embodiment of the present disclosure.
Figure 14:
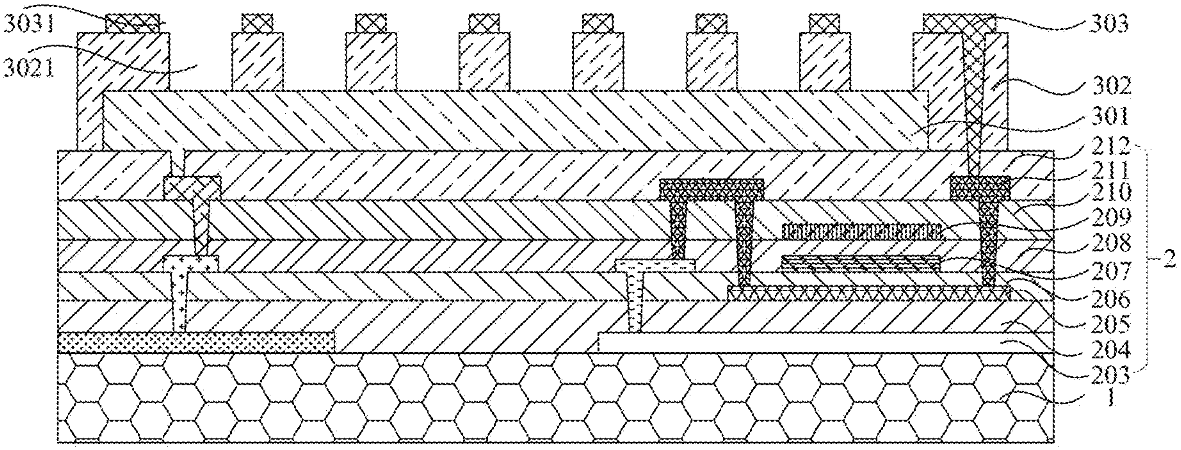
FIG. 14 is a structural diagram for forming a control electrode layer provided by an embodiment of the present disclosure.
Figure 15:
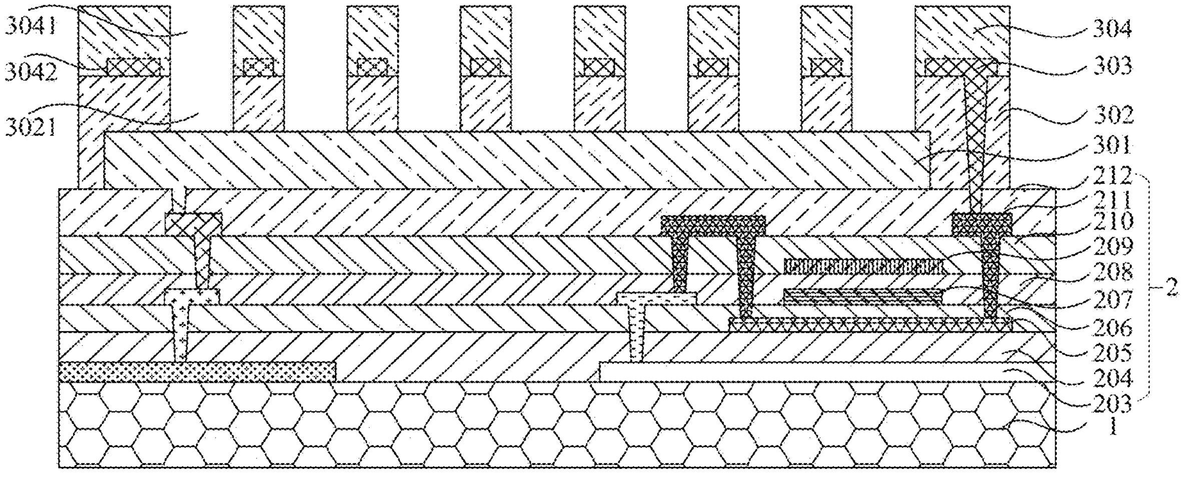
FIG. 15 is a structural diagram for forming a second insulating layer provided by an embodiment of the present disclosure.
Figure 16:
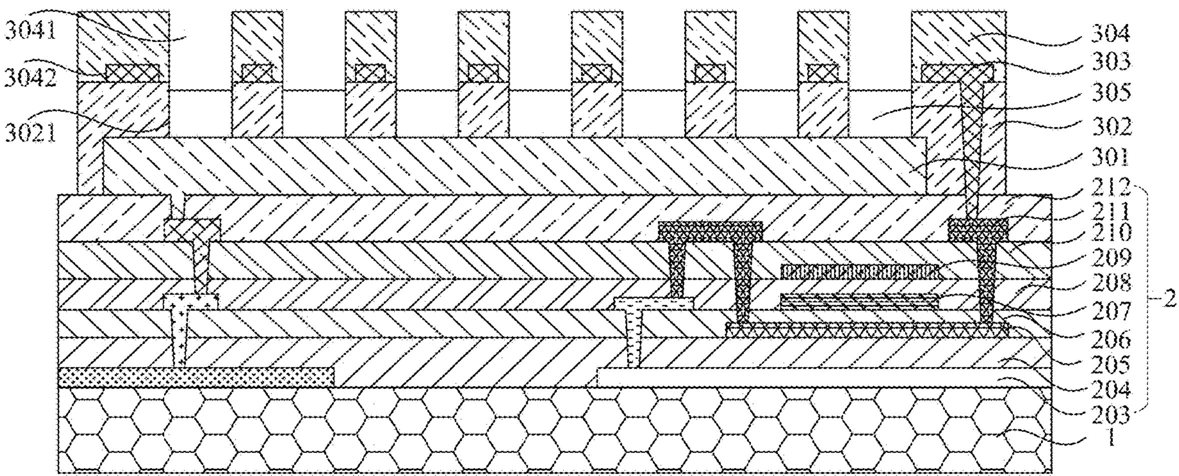
FIG. 16 is a structural diagram for forming an organic light-emitting layer provided by an embodiment of the present disclosure.
Figure 17:
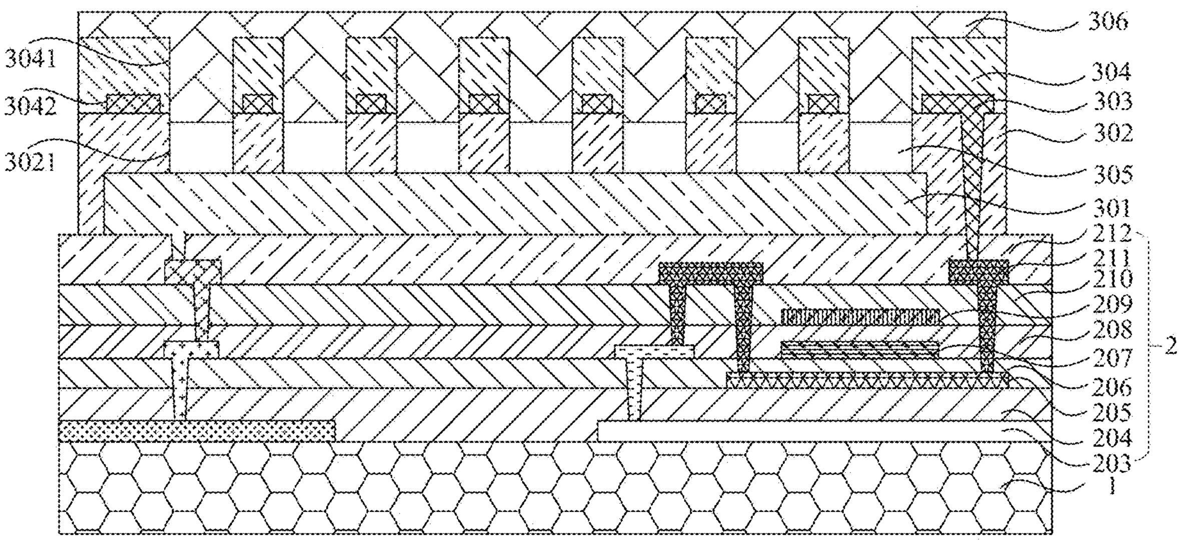
FIG. 17 is a structural diagram for forming an active layer provided by an embodiment of the present disclosure.
Figure 18:
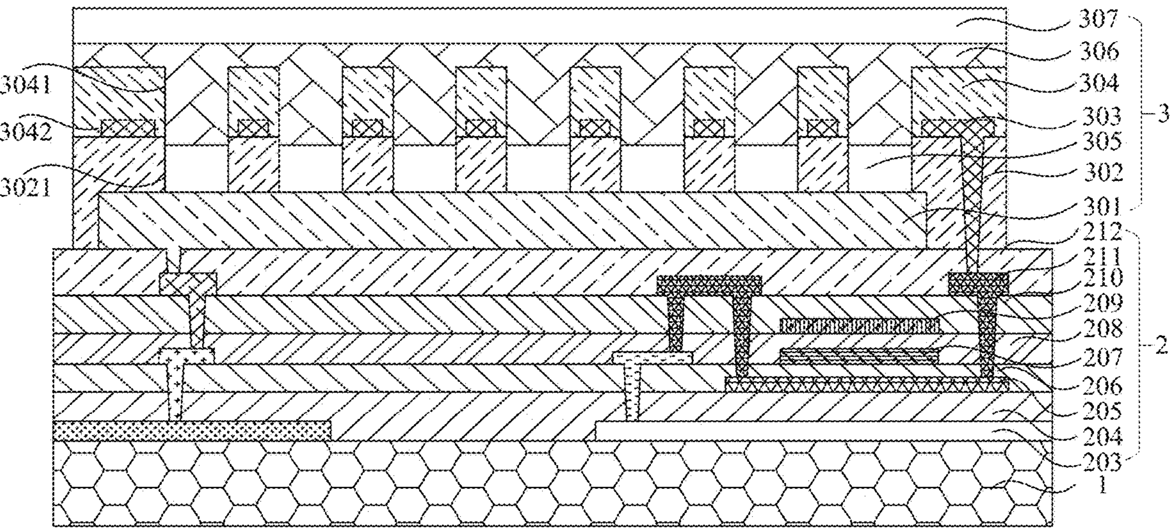
FIG. 18 is a structural diagram for forming a second electrode layer provided by an embodiment of the present disclosure.

As shown in FIG. 12, a first electrode layer is prepared on a side of the driving layer away from the base substrate, and the first electrode layer is electrically connected with the first circuit of the driving layer. As shown in FIG. 13, the first insulating layer is prepared on a side of the first electrode layer away from the base substrate, and a via hole running through the driving layer is provided. As shown in FIG. 14, a control electrode layer is manufactured on a side of the first insulating layer away from the base substrate, and the control electrode layer is electrically connected with the second circuit. As shown in FIG. 15, a second insulating layer is manufactured on a side of the control electrode layer away from the base substrate to separate the control electrode layer from the organic light-emitting layer and the active layer. As shown in FIG. 16, the organic light-emitting layer is manufactured in a region enclosed by the notch of the first insulating layer. As shown in FIG. 17, an active layer is formed on a side of the organic light-emitting layer away from the base substrate. As shown in FIG. 18, a second electrode layer is manufactured on a side of the active layer away from the base substrate.

After the control electrode layer is manufactured, the control electrode layer is patterned. After the second insulating layer is manufactured, the first insulating layer and the second insulating layer are patterned as a whole, or the first insulating layer and the second insulating layer are patterned simultaneously after the first insulating layer and the second insulating layer are manufactured, which is not limited in the embodiment of the present disclosure.

Figure 19:
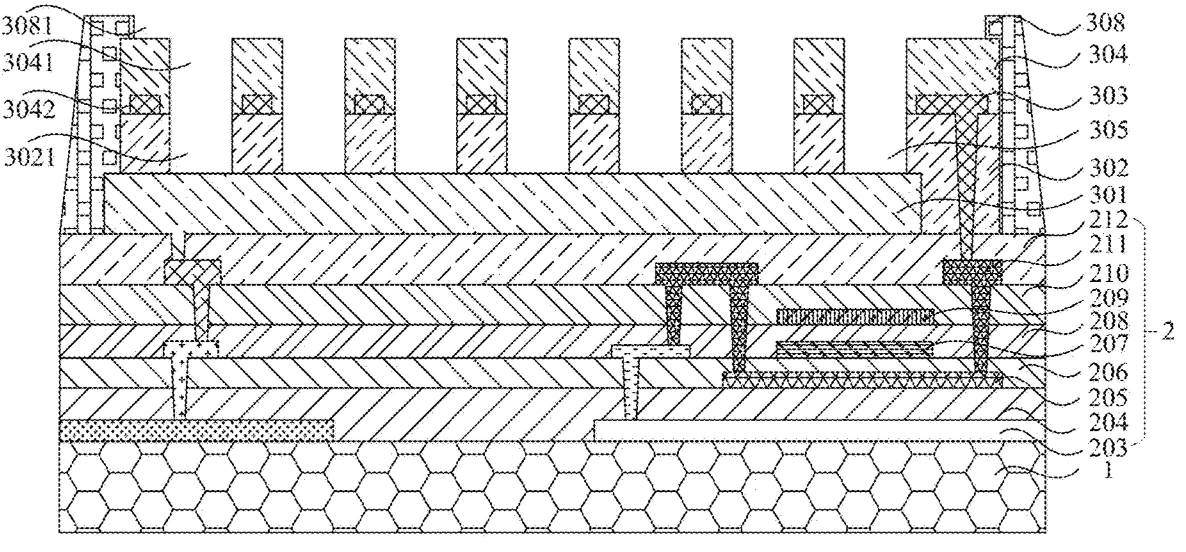
FIG. 19 is a structural diagram for forming a pixel defining layer provided by an embodiment of the present disclosure.

In addition, after the second insulating layer is manufactured, as shown in FIG. 19, the pixel defining layer may also be manufactured on a side of the driving layer away from the base substrate; on this basis, the organic light-emitting layer, the active layer and the second electrode layer are manufactured in turn.

In the embodiment of the present disclosure, as shown in FIG. 1 or FIG. 2, the display panel further includes a light-extracting layer and an encapsulation layer. After the second electrode layer is manufactured, the light-extracting layer and the encapsulation layer are sequentially manufactured on a side of the second electrode layer away from the base substrate. When the display panel is a bottom-emission display panel, the manufacture of the light layer may be omitted. That is, after the second electrode layer is manufactured, the encapsulation layer is manufactured on a side of the second electrode layer away from the base substrate.

The embodiment of the present disclosure also provides a display device. The display device includes a display panel according to the above embodiment.

The display device described in the embodiments of the present disclosure includes the display panel described in the above embodiments. In combination with the beneficial effect described in the above embodiments, the display device may increase the opening rate to improve the display brightness, and improve the resolution of the display screen. In addition, in the case that the control electrode layer is placed between the first electrode layer and the second electrode layer, and is wrapped by the first and second insulating layers, the limitation of the selection of the material of the first electrode layer is avoided, and the manufacturing process is simplified.

Those skilled in the art will readily contemplate other embodiments of the present disclosure after considering the specification and practicing the present disclosure. The present disclosure is intended to cover any variations, uses, or adaptive changes of the present disclosure. These variations, uses, or adaptive changes follow the general principles of the present disclosure and include the common general knowledge or conventional technical means in this art which is not described herein. The specification and examples should be considered as exemplary only, and the true scope and spirit of the disclosure should be defined by the appended claims.

What is claimed is:

1. A display panel, comprising:

a base substrate;

a driving layer, located on a side of the base substrate and provided with a plurality of pixel circuits, wherein the plurality of pixel circuits comprises a first circuit and a second circuit, the first circuit is configured to input a first power signal, the second circuit is configured to input a second power signal;

a light-emitting layer, provided with a plurality of light-emitting units corresponding to the plurality of pixel circuits, wherein each of the plurality of light-emitting units comprises a first electrode layer, a first insulating layer, a control electrode layer, a second insulating layer, an active layer and a second electrode layer sequentially distributed on a side of the driving layer away from the base substrate, as well as an organic light-emitting layer located between the first electrode layer and the active layer;

wherein the first insulating layer is defined with a notch to expose a partial region of the first electrode layer, an orthographic projection of the control electrode layer on the first insulating layer is located at a region outside the notch, the second insulating layer is configured to separate the control electrode layer from the organic light-emitting layer and the active layer, the organic light-emitting layer is provided on a surface of the first insulating layer away from the base substrate and is located in a region enclosed by the notch, an electronic injection capacity of the active layer is adjustable, the first electrode layer is electrically connected with the first circuit, and the second electrode layer is electrically connected with the second circuit;

wherein the second circuit comprises a driving transistor with a first electrode configured to input the second power signal and a second electrode electrically connected with the control electrode layer, and in response to that a voltage is applied to the control electrode layer, an electric field is formed between the control electrode layer and the second electrode layer to adjust the electron injection capability of the active layer.

2. The display panel according to claim 1, wherein the first insulating layer is defined with a first accommodating groove with an opening facing towards the second insulating layer, an accommodating cavity is enclosed by the first accommodating groove and a surface of the second insulating layer close to the first insulating layer, and the control electrode layer is located in the accommodating cavity.

3. The display panel according to claim 1, wherein the second insulating layer is defined with a second accommodating groove with an opening facing towards the first insulating layer, an accommodating cavity is enclosed by the second accommodating groove and a surface of the first insulating layer close to the second insulating layer, and the control electrode layer is located in the accommodating cavity.

4. The display panel according to claim 1, wherein at least a partial edge line of an orthographic projection of the first electrode layer on the driving layer is located in an orthographic projection of the first insulating layer on the driving layer, and the first insulating layer is defined with a via hole running through the driving layer, the control electrode layer is electrically connected with the second circuit through the via hole.

5. The display panel according to claim 4, wherein the first insulating layer is provided with a plurality of via holes, and the control electrode layer is electrically connected with the second circuit through the plurality of via holes.

6. The display panel according to claim 1, wherein a surface of the organic light-emitting layer away from the base substrate is lower than a surface of a portion of the control electrode layer close to the base substrate, and the portion of the control electrode layer is a portion of the control electrode layer orthogonally projected on the first electrode layer.

7. The display panel according to claim 1, wherein the first insulating layer is defined with a plurality of first through holes arranged in an array to form the notch.

8. The display panel according to claim 7, wherein the first through hole is a strip-shaped hole extending along a column direction, and the plurality of the first through holes are arranged at intervals along a row direction.

9. The display panel according to claim 7, wherein the first through hole is a cylindrical hole or a prismatic hole.

10. The display panel according to claim 7, wherein the second insulating layer is defined with a plurality of third through holes corresponding to the plurality of first through holes, and the organic light-emitting layer and the active layer are disposed within the plurality of first through holes and the plurality of first through holes.

11. The display panel according to claim 1, wherein each of the plurality of light-emitting units further comprises a pixel defining layer;

wherein the pixel defining layer is located between the driving layer and the second electrode layer, and a surface of the pixel defining layer facing towards the second electrode layer is higher than a surface of the second insulating layer facing towards the second electrode layer;

the pixel defining layer is defined with a second through hole, and an orthographic projection of the notch on the driving layer is located in an orthographic projection of the second through hole on the driving layer.

12. The display panel according to claim 11, wherein the surface of the pixel defining layer facing towards the second electrode layer is flush with a surface of the active layer facing towards the second electrode layer.

13. The display panel according to claim 11, wherein the second insulating layer of the plurality of light-emitting units is an entire surface structure, and the pixel defining layer is located on a side of the second insulating layer close to the second electrode layer.

14. The display panel according to claim 11, wherein the first insulating layer and the second insulating layer of the plurality of light-emitting units are arranged at intervals, and the first insulating layer and the second insulating layer are located in a region enclosed by the second through hole.

15. The display panel according to claim 1, wherein the first circuit comprises a plurality of adapter pieces distributed along a thickness direction of the driving layer, the plurality of adapter pieces are connected in series with an end electrically connected with the first electrode layer and the other end configured to input the first power signal.

16. The display panel according to claim 15, wherein the driving layer comprises a routing layer, a buffer layer, a semiconductor layer, a first gate insulating layer, a first gate metal layer, a second gate insulating layer, a second gate metal layer, a dielectric insulating layer, a source-drain metal layer and a planarization layer sequentially distributed in a direction away from the base substrate;

the routing layer comprises a first conductive line and a second conductive line, the semiconductor layer comprises an active portion, the active portion comprises a channel region, a first connection portion and a second connection portion, the first connection portion and the second connection portion are located on both sides of the channel region, the first gate metal layer comprises a first adapter piece, and the source-drain metal layer comprises a second adapter piece;

the first connection portion and the second connection portion form the first electrode and the second electrode of the driving transistor, respectively, the first connection portion is electrically connected with the second conductive line, and the second conductive line is configured to input the second power signal;

the first adapter piece is electrically connected with the first conductive line through a via hole running through the buffer layer and the first gate insulating layer, the second adapter piece and the first adapter piece are connected in series through a via hole running through the dielectric insulating layer and the second gate insulating layer, and the first electrode layer is electrically connected with the second adapter piece through a via hole running through the planarization layer.

17. The display panel according to claim 1, wherein a material of the active layer is an organic semiconductor, and a surface of the active layer facing towards the second electrode layer is a plane.

18. The display panel according to claim 1, wherein a material of the active layer is an n-type semiconductor.

19. A manufacturing method of display panel, comprising:

providing a base substrate;

forming a driving layer comprising a plurality of pixel circuits on a side of the base substrate, wherein the plurality of pixel circuit comprises a first circuit and a second circuit, the first circuit is configured to input a first power signal and the second circuit is configured to input a second power signal;

forming a light-emitting layer comprising a plurality of light-emitting units on a side of the driving layer away from the base substrate, wherein the plurality of light-emitting units correspond to the plurality of pixel circuits;

wherein each of the plurality of light-emitting units comprises a first electrode layer, a first insulating layer, a control electrode layer, a second insulating layer, an active layer and a second electrode layer sequentially distributed along a direction away from the base substrate, as well as an organic light-emitting layer located between the first electrode layer and the active layer;

wherein the first insulating layer is defined with a notch to expose a partial region of the first electrode layer, an orthographic projection of the control electrode layer on the first insulating layer is located in a region outside the notch, the second insulating layer is configured to separate the control electrode layer from the organic light-emitting layer and the active layer, the organic light-emitting layer is provided on a surface of the first insulating layer away from the base substrate and is located in a region enclosed by the notch, an electronic injection capacity of the active layer is adjustable, the first electrode layer is electrically connected with the first circuit, and the second electrode layer is electrically connected with the second circuit;

wherein the second circuit comprises a driving transistor with a first electrode configured to input the second power signal and a second electrode electrically connected with the control electrode layer, and in response to that a voltage is applied to the control electrode layer, an electric field is formed between the control electrode layer and the second electrode layer to adjust the electron injection capability of the active layer.

20. A display device comprising a display panel comprising:

a base substrate;

a driving layer, located on a side of the base substrate and provided with a plurality of pixel circuits, wherein the plurality of pixel circuits comprises a first circuit and a second circuit, the first circuit is configured to input a first power signal, the second circuit is configured to input a second power signal;

a light-emitting layer, provided with a plurality of light-emitting units corresponding to the plurality of pixel circuits, wherein each of the plurality of light-emitting units comprises a first electrode layer, a first insulating layer, a control electrode layer, a second insulating layer, an active layer and a second electrode layer sequentially distributed on a side of the driving layer away from the base substrate, as well as an organic light-emitting layer located between the first electrode layer and the active layer;

wherein the first insulating layer is defined with a notch to expose a partial region of the first electrode layer, an orthographic projection of the control electrode layer on the first insulating layer is located at a region outside the notch, the second insulating layer is configured to separate the control electrode layer from the organic light-emitting layer and the active layer, the organic light-emitting layer is provided on a surface of the first insulating layer away from the base substrate and is located in a region enclosed by the notch, an electronic injection capacity of the active layer is adjustable, the first electrode layer is electrically connected with the first circuit, and the second electrode layer is electrically connected with the second circuit;

wherein the second circuit comprises a driving transistor with a first electrode configured to input the second power signal and a second electrode electrically connected with the control electrode layer, and in response to that a voltage is applied to the control electrode layer, an electric field is formed between the control electrode layer and the second electrode layer to adjust the electron injection capability of the active layer.

* * * * *